United States Patent [19]
Huggins

[11] Patent Number: 6,080,533
[45] Date of Patent: *Jun. 27, 2000

[54] METHOD OF PATTERNING PHOTORESIST USING PRECISION AND NON-PRECISION TECHNIQUES

[75] Inventor: Alan H. Huggins, Gilroy, Calif.

[73] Assignee: Clear Logic, Inc., Santa Clara, Calif.

[ * ] Notice: This patent is subject to a terminal disclaimer.

[21] Appl. No.: 09/038,216

[22] Filed: Mar. 10, 1998

[51] Int. Cl.$^7$ ........................................................ G03F 7/20
[52] U.S. Cl. ............................................. 430/394; 430/945
[58] Field of Search ..................................... 430/312, 394, 430/396, 945

[56] References Cited

U.S. PATENT DOCUMENTS

| | | | |
|---|---|---|---|
| 5,561,011 | 10/1996 | Miyazaki | 430/7 |
| 5,885,749 | 3/1999 | Huggins | 430/312 |
| 5,919,605 | 7/1999 | Uchiyama | 430/312 |

*Primary Examiner*—Kathleen Duda
*Attorney, Agent, or Firm*—Skjerven, Morrill, MacPherson, Franklin & Friel, LLP; Tom Chen

[57] ABSTRACT

A method for patterning a layer of photoresist includes the steps of 1) exposing the photoresist through a standard precision mask to define all possible patterns and features, and 2) selecting desired patterns and features with a non-precision targeting energy beam or mask. Consequently, no custom precision masks are required to pattern the various layers of photoresist during the fabrication of application specific integrated circuits (ASICs), thereby reducing both the lead-time and costs for manufacturing ASICs.

7 Claims, 3 Drawing Sheets

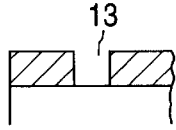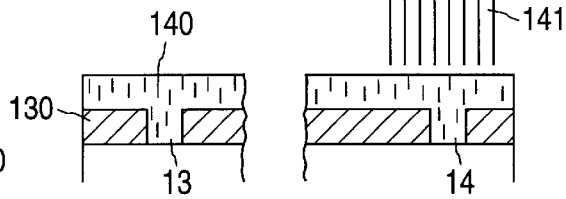
FIG. 13  FIG. 14
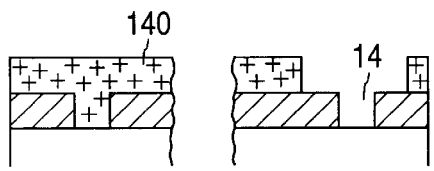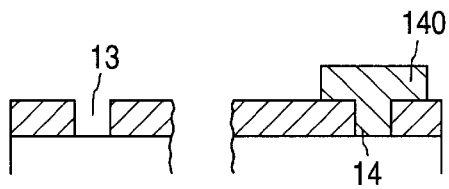
FIG. 15  FIG. 16
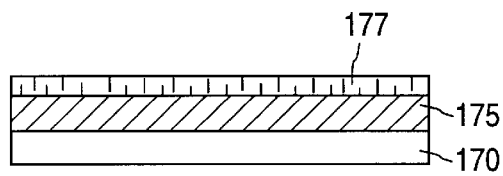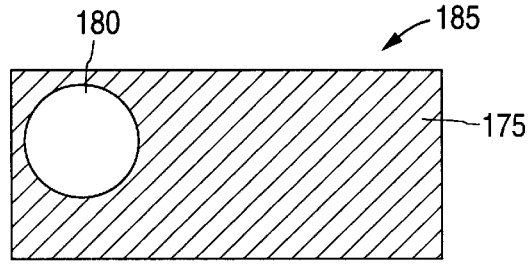
FIG. 17  FIG. 18A
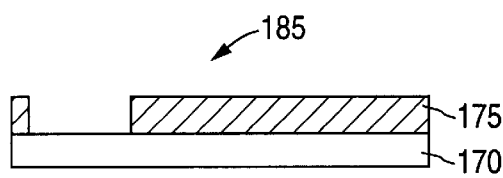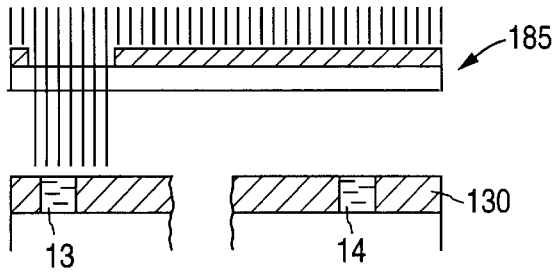
FIG. 18B  FIG. 19

METHOD OF PATTERNING PHOTORESIST USING PRECISION AND NON-PRECISION TECHNIQUES

CROSS REFERENCE TO RELATED APPLICATIONS

This application is related to commonly-owned U.S. patent application Ser. No. 08/823,777, entitled "Method of Customizing Integrated Circuits Using Standard Masks and Targeting Energy Beams for a Single Resist", filed Mar. 24, 1997, Ser. No. 08/823,778, entitled "Method of Customizing Integrated Circuits Using Standard Masks and Targeting Energy Beams", filed Mar. 24, 1997, Ser. No. 08/846,163, entitled "Method of Customizing Integrated Circuits by Selective Secondary Deposition of Interconnect Material", filed Apr. 25, 1997, and Ser. No. 08/879,542, entitled "Method of Customizing Integrated Circuits by Selective Deposition of Layer Interconnect Material", filed Jun. 20, 1997.

FIELD OF THE INVENTION

The present invention relates to methods of patterning photoresist, and more particularly to methods for combining precision and non-precision photolithography processes to pattern photoresist.

BACKGROUND OF THE INVENTION

Photolithography is used to transfer specific patterns onto semiconductor devices or integrated circuits during the fabrication process. A masking step transfers the pattern of a photomask onto a photoresist layer on the device surface by exposing the photoresist through the mask. Selected areas of the photoresist, based on the pattern of the mask, are then etched so that subsequent process steps, such as impurity introduction, oxidation, and metallization, can be performed. A semiconductor device with the desired electrical properties is then obtained after several of these application-specific masking and processing steps.

For example, a custom or application specific-integrated circuit (ASIC), frequently used to implement new circuit designs, may require several different custom masks during the fabrication process since each layer of the device needs to be specifically patterned. Because precision custom masks are costly to manufacture, a large quantity of each integrated circuit (IC) type must be produced in order for the fabrication process to be economical. However, as technology advances, circuit designs become more application-specific and are typically required at a much lower volume than the more generic ICs, thus making fabrication of such application-specific ICs more expensive per unit.

In an attempt to reduce the costs per unit of ASICs, a current practice is to use gate arrays to customize integrated circuits in order to minimize the number of different custom configuration mask steps. Gate arrays are mass-produced integrated circuits containing generic arrays of circuit elements ("gate array blanks"), which can be customized into application-specific ICs with a small number of masks defining custom interconnections of the circuit elements at the final steps of fabrication. The gate array blanks can be manufactured up to the customization steps and stored away until an order for a particular application-specific circuit is received. A precision configuration mask is then used to customize the specific gate arrays. However, the high costs of precision configuration masks limit the extent that costs and lead-time of ASICs manufacturing can be reduced.

An alternative method is to use direct write-on-wafer technology on gate array processing to replace the steps requiring custom configuration masks. However, using programmable direct-write machines can still incur substantial costs to the manufacture of prototype and production ASICs. Electron beam (E-beam) direct-write technology employs high-cost equipment with a low throughput. On the other hand, laser-based direct-write systems do not have the resolution needed to meet the performance and total die size requirements of present designs. Even though less expensive than E-beam systems, laser based systems are still more expensive and of lower precision than standard optical reduction steppers or other comparable methods using a standard set of precision photomasks.

Accordingly, it is desirable to pattern photoresist so that fabricating customized integrated circuits can be accomplished without the drawbacks of conventional methods in order to reduce both lead-time and costs of designing and manufacturing ASICs.

SUMMARY OF THE INVENTION

According to the present invention, a method is provided for patterning photoresist by combining precision and non-precision lithography without the need of a precision configuration mask, thereby reducing costs, complexity, and lead-time for fabricating an application specific integrated circuit (ASIC). A standard precision mask or another precision technique (hereinafter referred generally as "mask") is first used to define all possible patterns on the photoresist for a selected application or user. The photoresist is then customized using a non-precision technique to select the desired patterns defined by the precision mask. Thus, the precision mask controls the feature size, while the non-precision step selects which features are desired.

In one embodiment of the present invention, negative photoresist on a wafer surface is patterned to create desired openings in the photoresist. The resist is exposed through a standard precision photomask in all areas except where all possible openings will exist, and thus, the size, location, and shape of the possible openings are determined by the precision mask. A laser direct-write machine or other non-precision direct-write technique (hereinafter referred generally as "laser") is then used to expose areas, typically larger than the previously created photomask possible openings, which are not to be subsequently acted upon. The resist is then developed to uncover the desired openings which were not exposed by either the mask or laser, i.e., the logical NOR of the mask's clear and transparent areas and the laser exposures. The device may then be etched or acted upon through these desired resist openings.

In another embodiment, positive resist is patterned to create desired openings in the photoresist. The resist is exposed at all possible openings through a mask, which defines the size and shape of the possible openings. However, the time and energy of the mask exposure is kept below the threshold for complete exposure of the resist, which is generally referred to as the clearing energy of the resist. A laser then exposes locations on the resist overlapping areas where openings are desired. The time and energy of the laser exposure is insufficient to fully expose the resist by itself, but is sufficient when combined with the mask exposure step. The resist is then developed to uncover openings exposed by both the mask and laser, i.e., the logical AND of the two exposure steps. The device can then be etched or acted upon based on the resist pattern.

In another embodiment of the present invention, positive resist is patterned with lines and specific locations of potential cut points for disconnecting the lines. The resist is exposed through a standard mask to define lines (unexposed) and spaces (exposed). A laser then exposes selected cut points within the lines and the resist is developed to uncover areas exposed by the mask or the laser, i.e., a logical OR of the mask's clear and transparent areas and laser exposures. The device may then be etched or acted upon accordingly.

Another embodiment of the present invention patterns negative resist with lines and possible connection points between lines. The resist is exposed through a mask to define lines (exposed) where the resist is to cover the structure and gaps (unexposed) where the resist is to be removed. A laser exposes additional areas between lines where resist is desired to cover the structure, creating selected additional connections between lines. The resist is developed and areas of the resist left unexposed by the mask or laser are removed for a logical OR of the mask's clear and transparent areas and laser exposures. Etching or other processing can then be performed on the patterned resist.

In another embodiment of the present invention, two resist layers are patterned. A first layer of positive or negative resist is deposited on the device. The first layer is exposed through a mask (with corresponding changes in the mask polarity depending on the resist polarity) to define the dimensions of the pattern. The resist is then developed to remove the desired resist areas. A second layer of resist (positive or negative) is applied over the first resist and portions of the device uncovered by the previous mask exposure. A laser (with corresponding changes to the write pattern depending on the resist polarity) selects the portions on the second resist layer, which are then developed to uncover the desired areas of the device for etching or other processing.

In the above embodiments, a laser is used to select the desired patterning. However, in yet other embodiments, irradiation through a non-precision configuration mask can replace the non-precision direct-write step. The configuration mask can be made by first applying an opaque layer onto a mask blank and then depositing a resist layer over the opaque layer. A laser then exposes portions of resist over the opaque layer, and desired areas of the mask are removed through conventional mask-making methods. Alternatively, a laser can remove desired opaque areas by direct ablation. Furthermore, a configuration mask can be modified by removing additional opaque areas or re-used by applying another layer of opaque material and using the laser beam to expose or ablate new areas. The old opaque material may be removed or left in place.

Accordingly, these above methods of combining precision and non-precision techniques can be used to customize integrated circuits without requiring a customized precision configuration mask, thereby reducing time and costs for manufacturing such masks.

This invention will be more fully understood upon consideration of the detailed description below taken together with the accompanying drawings.

BRIEF DESCRIPTION OF THE DRAWINGS

FIGS. 13–16 are illustrative sectional views representing a patterning method of using two photoresist layers; and FIGS. 17–19 are illustrative sectional views representing a method for customizing a non-precision mask for use in the present invention.

Use of the same reference numerals in different figures indicates similar or like elements.

DETAILED DESCRIPTION OF THE PREFERRED EMBODIMENTS

The present invention provides a method for patterning photoresist on a wafer by combining precision and non-precision lithography without the need of a precision configuration mask. The present invention uses a standard precision mask or other precision technique (hereinafter referred to generally as "mask") to first define all possible patterns on a photoresist for a specific type of application or user. A laser or other non-precision technique (hereinafter referred to generally as "laser") then selects the desired features to customize the photoresist. Thus, the mask defines the dimensions of the features, while the laser selects which features are to be acted upon.

Figure 1:
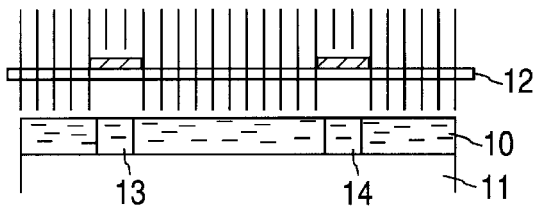
FIGS. 1–3 are illustrative sectional views representing steps to pattern negative photoresist according to one method of the present invention.
Figure 2A:
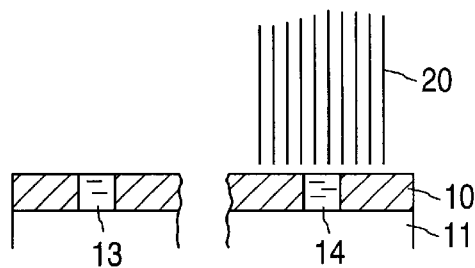
Figure 2B:
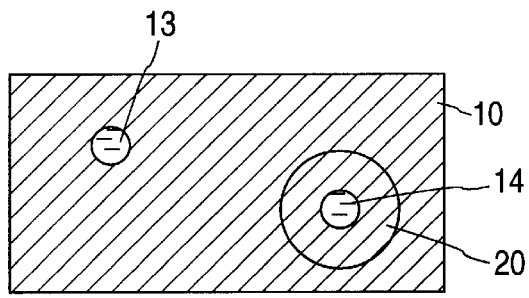
Figure 3:

FIGS. 1–3 illustrate one embodiment of the present invention for patterning negative photoresist. In FIG. 1, a layer of negative polarity photoresist ("resist") 10 is deposited on a wafer structure 11 or any other surface to be acted upon after the resist is patterned. Resist 10 is then exposed by a light source through a standard precision mask 12. Mask 12 is opaque at all the possible resist openings for a general use or for a particular user, leaving all possible openings on resist layer 10 unexposed. While many possible openings normally exist, FIG. 1 shows only two possible openings 13 and 14 for illustrative purposes.

A laser 20 then exposes the possible openings defined with the standard mask which are to remain protected by resist 10. In FIGS. 2A and 2B, representing respective side and top views, possible opening 14 is exposed by laser 20, which is typically, but not necessarily, larger than the dimensions defined by standard mask 12. Resist 10 is then developed to uncover desired opening 13, as shown in FIG. 3. Structure 11 may then be etched, implanted or otherwise acted upon with the pattern of the selected openings defined by resist 10.

Openings are defined in this manner by a logical NOR of a precision exposure (e.g., reduction stepper with standard precision masks) and a laser exposure, where the size of the openings are defined with the smaller of the exposure steps, typically the precision exposure. The selection of the openings are then determined by the laser exposure. The order of the two exposure steps may also be reversed. Regardless of the order, the laser beam radius, as seen from FIG. 2B, can be approximately equal to the minimum center-to-center distance between opening placements—½*minimum opening dimension—registration difference between two exposure steps without affecting other openings. This method allows the density of the stepper system to be maintained while allowing a zero mask-cost configuration of the laser system for manufacturing. Furthermore, the amount of data to be written and the pixel density requirements for the laser system may be reduced, thereby reducing both the time and cost to process a device when compared to an entirely laser-based approach.

Figure 4:
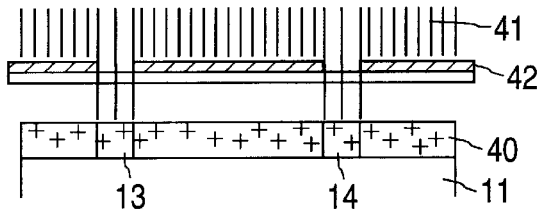
FIGS. 4–6 are illustrative sectional views representing steps to pattern positive photoresist according to another method of the present invention.
Figure 5A:
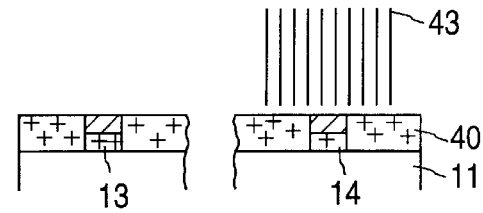
Figure 5B:
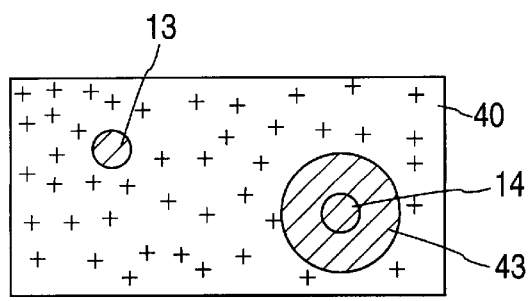
Figure 6:
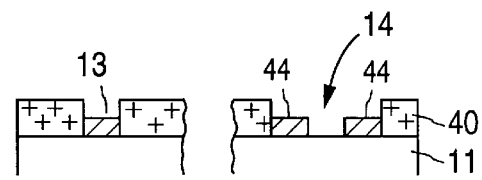

FIGS. 4–6 illustrate another embodiment of the present invention using a logical AND for patterning positive resist.

In FIG. 4, a layer of positive resist 40 is deposited on structure 11. Resist 40 is exposed by a light source 41 through a mask 42 to define all possible openings 13 and 14. Exposure by light source 41 is kept below the clearing energy of resist 40, i.e., the amount of energy required to fully develop the resist. A laser 43 then exposes desired opening 14 to fully expose opening 14, as shown in respective side and top views, FIGS. 5A and 5B. The energy of the laser exposure step is similarly kept below the clearing energy of resist 40. However, the combined energy of light source 41 and laser 43 is at least the clearing energy, and therefore sufficient for complete resist development. FIG. 6 shows the area which was exposed by both exposure steps developed to uncover opening 14. Possible opening 13 and area 44, which were exposed by only one exposure step, remain covered with resist 40. Structure 11 may then be etched, implanted, or otherwise acted upon with the pattern of the selected openings defined by the logical AND of the mask's clear and transparent areas and the laser exposures.

As with the previous embodiment, the size and shape of the desired openings are defined by the mask, while the openings are selected by the laser. The exposure steps can similarly be reversed. However, while the allowable laser beam diameter is the same as for the previous embodiment, the exposure requirements for the laser and mask are stricter. Specifically, the exposure time and energy must be controlled such that each exposure step by itself does not exceed the clearing energy of the resist. On the other hand, an advantage of this method is that a dark-field precision mask can be used, which is less sensitive to contamination causing defects. Furthermore, the ability to use positive resist may eliminate the need to add a negative resist process to the manufacturing line, which is a further advantage.

Figure 7:
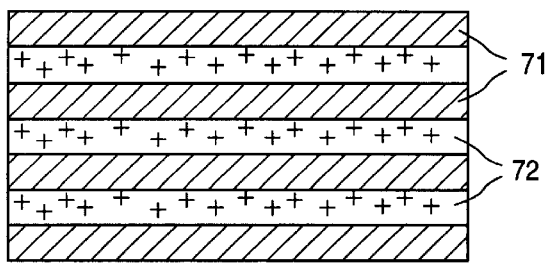
FIGS. 7–9 are illustrative sectional views representing a method to pattern lines and gaps in positive photoresist.
Figure 8:
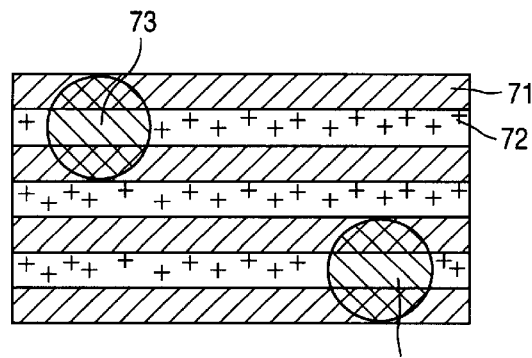
Figure 9:
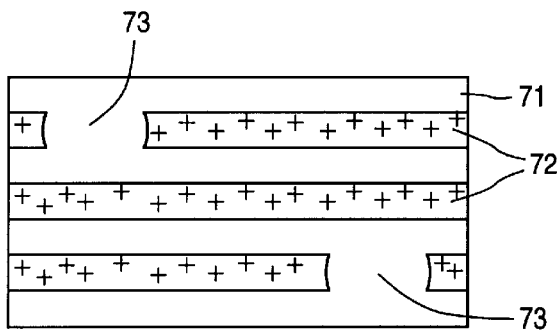

FIGS. 7–9 illustrate an embodiment of the present invention for patterning positive resist with lines and selected gaps within lines. In FIG. 7, a layer of positive resist is deposited over a structure (not shown) to be patterned. The resist is exposed through a precision mask or other precision technique to define spaces 71 (exposed areas) and lines 72 (unexposed areas). A laser then exposes gaps 73 within lines 72, as shown in FIG. 8. The resist is developed to remove areas exposed by the mask or the laser, resulting in the desired pattern of spaces 71 and gaps 73 uncovered by resist and lines 72 covered by resist, as shown in FIG. 9. The structure may then be etched or acted upon with the pattern of the selected spaces and gaps defined by the logical OR of the mask's clear and transparent areas and the laser exposures. The dimensions of the spaces and lines are determined by the precision step, while the gaps within the lines are determined by the laser step, with the order of steps interchangeable. The diameter of the laser beam can be approximately 2*space dimension+line dimension−2*registration difference between the two exposure steps without affecting adjacent lines, as seen from FIG. 8.

Figure 10:
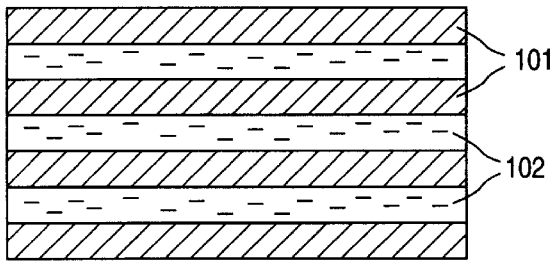
FIGS. 10–12 are illustrative sectional views representing a method to pattern lines and line connections in negative photoresist.
Figure 11:
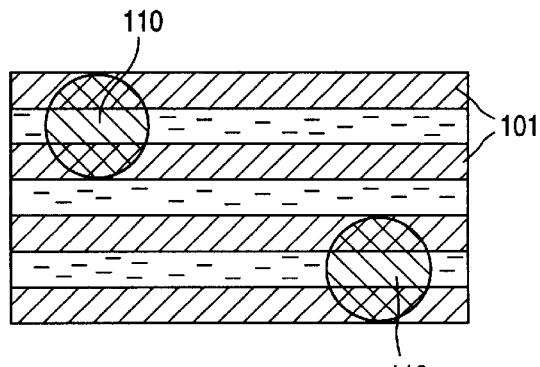
Figure 12:
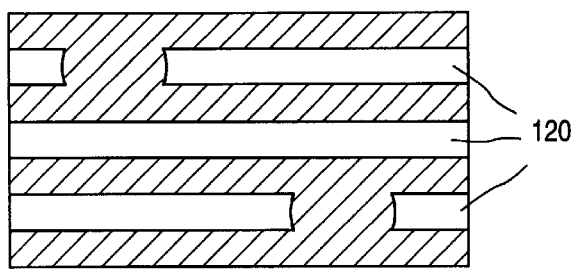

FIGS. 10–12 illustrate an embodiment of the present invention to pattern negative photoresist with lines and connections between lines. FIG. 10 shows a layer of negative resist applied over a structure (not shown) to be patterned. The resist is exposed through a mask to define lines 101 where the resist is to cover the structure and to define spaces 102 where the resist is to be removed. A laser then exposes areas 110 between lines 101 where additional resist is desired to cover the structure, as shown in FIG. 11. The resist is developed and areas 120 of the resist left unexposed by the mask or laser are removed, resulting in the pattern in FIG. 12. Unexposed areas 120, defined by the logical NOR of the mask's clear and transparent areas and the laser exposures, can then be etched or otherwise acted upon. The lines and spaces are defined by the precision step and the additional resist or connections between the lines are defined by the non-precision laser step, where the performance order of the steps can be reversed if desired. The diameter of the laser exposure can be approximately 2*line dimension+space dimension−2*registration difference between the two exposure steps without affecting adjacent spaces.

Whereas the above embodiments expose one resist layer two times, FIGS. 13–16 illustrate an embodiment for patterning resist which exposes each of two resist layers only once. A layer of resist is exposed through a mask and developed to uncover all possible openings. The resist can be negative or positive, accompanied with a corresponding change to the polarity of the mask, as shown in FIGS. 1 and 4, respectively. FIG. 13 shows a resist 130 with possible openings 13 and 14 after resist 130 is developed and hardened if desired. Another layer of resist 140, which can be positive or negative, is deposited over resist 130 and openings 13 and 14, as shown in FIG. 14. A laser 141 then exposes resist 140 in an area surrounding opening 14. In FIG. 15, resist 140 is positive. After laser 141 exposes desired opening 14, resist 140 is developed to uncover opening 14. Alternatively, resist 140 can be negative as shown in FIG. 16. After laser 141 exposes openings 14 to be covered, resist 140 is developed to uncover desired opening 13 while leaving a resist plug over opening 14. The structures in FIGS. 15 and 16 can then be etched or otherwise acted upon based on the patterned resist.

If both steps use the same polarity resist, the redundancy of the resist layers can help reduce the defect density and allows the use of a thinner resist layer for the precision lithography step without compromising total resist thickness, which protects against etch erosion in areas of the circuit more than one-half the laser spot size away. The reduction in resist thickness can be used to tailor the contour of subsequent etchings of the openings. However, if the two steps use different polarity resists, the precision lithography step can be optimized for size control and manufacturing ease, and the polarity of the direct-write step can be chosen separately to minimize the amount of data to be written, i.e., choose the resist polarity requiring the least amount of laser exposures. As a result, throughput is increased and the cost of the direct-write step is reduced.

This two resist method can be similarly used in the non-precision steps for the embodiments of FIGS. 10–12 discussed above. Furthermore, this method can be used whereby the first and/or second resist layers need not be kept during the entire processing step. For instance, either lithography step (precision or non-precision) may create a resist pattern which is transferred by etch, implantation or other technique to an underlying layer. The first resist can then be removed, with the underlying pattern taking the place of the first resist. The second resist is deposited and the structure subsequently processed.

Examples of subsequent processing steps using the above-described methods of patterning resist are given in commonly-owned U.S. patent application Ser. Nos. 08/823, 777, 08/823,778, 08/846,163, and 08/879,542 referenced above.

Although optical reduction steppers and laser machines are used in the description of this invention, any precision lithographic system used in conjunction with any direct-write system are also suitable for carrying out the present invention. Further, it will be understood by one skilled in the art that a negative resist process can be replaced with a positive resist process with image reversal to achieve the same results. Additionally, the processes defined with single develop steps may be replaced with multiple develop steps for positive resist processing.

In the above described methods, a laser is used to select desired openings in the resist. Alternatively, rather than using a laser beam to expose the resist, irradiation through a laser-manufactured non-precision mask can also be used. FIGS. 17–19 illustrate one way to manufacture and use such a mask. In FIG. 17, a mask blank 170 is covered with an opaque material 175, which is covered by a positive or negative resist layer 177. A laser 180 then exposes desired portions of resist layer 177, and the selected portions of the resist and opaque layers are removed using conventional methods. After the remaining resist 177 is removed, mask 185 is formed as shown in FIGS. 18A and 18B. An alternative method of forming mask 185 uses direct ablation by a laser to remove opaque material 175, thereby eliminating the need for a resist layer. Mask 185 can then be used in place of the laser step in the previous embodiments for patterning the resist, as shown in FIG. 19 for example.

Using laser manufactured non-precision configuration masks provides many advantages not found in using a laser beam directed on the resist layer. Using a configuration mask to select resist openings or connections allows an entire photoresist layer on an integrated circuit or a series of integrated circuits to be exposed at once, thereby greatly reducing the time spent at the exposure step, increasing the throughput, and reducing manufacturing costs when large volumes of units are required. In addition, laser use is greatly reduced because the laser beam is needed only to manufacture a configuration mask rather than to directly expose patterns on each photoresist layer of an integrated circuit. For example, if five hundred openings are required to customize or pattern an IC, it would require five million laser pulses to manufacture ten thousand devices of this design. However, if a non-precision configuration mask of the present invention is used, only five hundred laser pulses are needed to produce the same number of devices.

The non-precision configuration mask provides additional advantages. Because of the reduced dimension control, registration, and volume of data requirements, the non-precision configuration mask is much less costly and time-consuming to manufacture than precision configuration masks, which results in a reduction of the per design fixed costs for the manufacture of the end units. The non-precision nature of the mask also reduces the requirements, and therefore the cost, of the reduction stepper (or aligner) used to apply the image of the configuration mask to the resist. Using, preferably, an older and less costly generation stepper with lower resolution capability than that of the standard precision masks allows the laser manufactured non-precision mask to be less precisely made because small imperfections in the edge definition of the mask and small splatters of debris or foreign matter will not be resolved onto the resist. As a result, the susceptibility to defects in the manufacture of the mask or to later contamination during storage or use of the mask is reduced. Time and costs can be further reduced because the masks can be re-used by simply removing the old layer of opaque material, then applying a new layer of opaque material and forming the new desired exposure points to create a new configuration mask.

The above-described methods to pattern photoresist offers several advantages over previous methods of patterning photoresist to customize integrated circuits. Because no precision configuration mask is required for each different customization, both the cost and lead-time to produce an application-specific integrated circuit (ASIC) are reduced. In the present invention, the only precision masks required are those used to form the ASIC blank which is then available for use by a large number of possible designs. ASIC blanks can be stored until they are ready to be customized, which then only requires a laser beam to selectively define the desired areas to be connected or disconnected. Prior methods require manufacturing precision configuration masks for each new design, which greatly increases the cost and latency between the time the user provides the design to the manufacturer and the time the user receives the ASIC. Therefore, per design costs and the time to delivery are reduced. Furthermore, since the time required to prepare for the actual customization of the die is now only the time needed to determine the coordinates and control signals for the laser machine, near instantaneous release of the design to the production facility is possible when compared to the time required to manufacture and check a precision configuration mask. In addition, the per design expense of the precision configuration masks are eliminated.

Another advantage is that the production of small numbers of units becomes economically feasible with the present invention. Often the need to check system designs with actual working ICs leads to the need for prototype units to be built in very small quantities, often two dozen or less. The present invention allows this to be done economically by both eliminating the need for precision configuration masks and allowing multiple custom devices to be built on the same wafer. Previous methods which required the production of one or more precision configuration masks for each design would require that large numbers of units be produced in order for the per-design mask purchase costs to amortize down to reasonable per unit costs. The present invention allows for designs to be implemented without such costs and the need to amortize them, such that production of very small lot quantities, including quantities of less than a full wafer, become economical.

An alternative use of laser beams in the industry is to use lasers to blast connecting links between circuits (laser fuses) allowing customization or repair of circuitry. The present invention has advantages over this previous method in that the energy delivery to the wafer by the laser beam is very low. Consequently, cut points or connection points in the present invention can be placed above active circuitry in contrast to laser fuses of previous techniques, which dictate that circuitry or conductors lie outside the laser beam diameter in order to avoid damage. The methods described above further eliminate problems associated with laser fuses. Common repair practices include using laser-blown fuses, laser-connected antifuses or electrically programmed bits to control the deactivation of defective circuit sections and the activation of replacement circuit sections. Using methods of the present invention, activation and deactivation can be controlled by conductors, which may be selectively connected or disconnected for each specific IC to effectuate repairs within a smaller die area and with a tighter pitch between elements than with prior techniques. With prior methods, laser fuses and conductors, which carry signals in and out of the fuses, must be separated from one another by more than the minimum pitch of the conductor layer on which they are formed because current resolution of laser spot sizes are below the dimensions of lines and spaces formed through precision masking techniques. The present invention eliminates this problem by allowing laser fuses to be replaced with, for example, potential cut points on lines spaced at the minimum attainable conductor pitch, regardless of the laser beam size.

The present invention also reduces cost of the laser machine due to the lower energy delivery and the less exacting energy delivery controls needed to avoid wafer damage. The cost of the laser machine may also be reduced because the spot size requirements are less restrictive in the present invention than previous methods utilizing laser fuses. This is because the only area affected by the beam is defined by the overlap of the standard precision cut-point mask and the area exposed (or not) by the laser beam. The dimensions of this overlap are therefore determined by the dimensions of the precision cut-point mask rather than the laser beam size.

The detailed description is provided above to illustrate specific embodiments of the present invention and is not intended to be limiting. Numerous modifications and variations are possible within the scope of the present invention. For example, these techniques are not limited to production of ASICs, but apply to any photo-defined process requiring the alteration of the photo-defined areas beyond one standard pattern. Other applications of these techniques include the production of read-only memories (ROMs), the selection of alternative modes of operation of standard devices, and the repair of memory or logic circuits. The present invention is defined by the appended claims.

What is claimed is:

1. A method for patterning photoresist, comprising the steps of:

exposing a first photoresist layer using a precision photolithography technique to define all possible patterns and features for a specified general application;

developing and removing portions of the first photoresist layer at said possible patterns and features;

depositing a second photoresist layer over said first photoresist layer;

selectively exposing said second photoresist layer to define desired features and patterns using a non-precision photolithography technique; and developing and removing portions said second photoresist layer at said desired features and patterns.

2. The method of claim 1, wherein said exposing step using the precision photolithographic technique is performed by exposure through a photomask.

3. The method of claim 1, wherein the non-precision photolithographic technique is a non-precision direct-write technique.

4. The method of claim 3, wherein said non-precision direct-write technique is with a laser.

5. The method of claim 1, wherein said first and second photoresist are of the same polarity.

6. The method of claim 1, wherein said first and second photoresist are of opposite polarity.

7. The method of claim 1, further comprising the step of hardening portions of said first photoresist remaining after the developing and removing of portions of the first photoresist layer.

* * * * *